United States Patent [19]
Cho

[11] Patent Number: 5,985,694
[45] Date of Patent: Nov. 16, 1999

[54] SEMICONDUCTOR DIE BUMPING METHOD UTILIZING VACUUM STENCIL

[75] Inventor: Yeuk-Chow Cho, Austin, Tex.

[73] Assignee: Motorola, Inc., Schaumburg, Ill.

[21] Appl. No.: 08/939,641

[22] Filed: Sep. 29, 1997

[51] Int. Cl.[6] .................................................. H01L 21/44
[52] U.S. Cl. ........................ 438/108; 438/120; 438/613
[58] Field of Search .......................... 438/108, FOR 343, 438/120, 613; 228/180.22, 212, 248.1, 254; 29/840, 841

[56] References Cited

U.S. PATENT DOCUMENTS

| | | | |
|---|---|---|---|
| 5,284,287 | 2/1994 | Wilson et al. | 228/180.22 |
| 5,403,776 | 4/1995 | Tsuji et al. | 29/843 |
| 5,431,332 | 7/1995 | Kirby et al. | 228/246 |
| 5,445,313 | 8/1995 | Boyd et al. | 228/248.1 |
| 5,464,652 | 11/1995 | Himmel et al. | 427/97 |
| 5,620,927 | 4/1997 | Lee | 29/841 |
| 5,704,116 | 1/1998 | Gamota et al. | 29/840 |
| 5,744,171 | 4/1998 | Schneider | 425/110 |
| 5,749,614 | 5/1998 | Reid et al. | 294/64.1 |
| 5,816,482 | 10/1998 | Grabbe | 228/212 |
| 5,839,191 | 11/1998 | Economy et al. | 29/843 |
| 5,849,606 | 12/1998 | Kikuchi et al. | 438/108 |
| 5,868,305 | 2/1999 | Watts, Jr. et al. | 228/254 |
| 5,885,849 | 3/1999 | DiStefano et al. | 438/108 |
| 5,890,283 | 4/1999 | Sakemi et al. | 29/840 |

FOREIGN PATENT DOCUMENTS

| | | |
|---|---|---|
| 283024 | 2/1987 | Germany . |
| 62-25435 | 2/1987 | Japan . |
| 1-129446 | 5/1989 | Japan . |

*Primary Examiner*—Olik Chaudhuri
*Assistant Examiner*—Alonzo Chambliss
*Attorney, Agent, or Firm*—Robert A. Rodriguez

[57] ABSTRACT

A method of bumping a semiconductor device, including the steps of providing a semiconductor device (100) having a plurality of bumping sites (104), providing a plurality of solder spheres (210), providing a stencil (200) having a plurality of stencil sites (202), each stencil site (202) having a depression and a through hole (204) extending through the stencil(200), placing the plurality of solder spheres (210) on the stencil such that each stencil site of the plurality of stencil sites (202) holds a single solder sphere of the plurality of solder spheres (210), applying a vacuum to the plurality of solder spheres (210), through the vacuum through holes (204), aligning the plurality of solder spheres (210) with the plurality of bumping sites (104) of the semiconductor device (100), releasing the vacuum to release the plurality of solder spheres (210) from the stencil (200) such that the plurality of solder spheres (210) is placed on the plurality of bumping sites (104), and reflowing the plurality of solder spheres (210). A method for packaging a semiconductor die utilizing a stencil and applying vacuum is also disclosed.

26 Claims, 4 Drawing Sheets

SEMICONDUCTOR DIE BUMPING METHOD UTILIZING VACUUM STENCIL

BACKGROUND OF THE INVENTION

The present invention is drawn to a new method of bumping a semiconductor device (either a singulated die or a plurality of die in wafer form) and attaching a semiconductor die to a substrate. Alternatively stated, the present invention is drawn to chip-to-package interconnections or first-level packaging interconnections for packaging semiconductor die.

Several techniques have been utilized in the prior art to execute chip-to-package interconnections. Conventional techniques include wire bonding and tape automated bonding. However, as is well known in the art, such prior art techniques suffer from numerous disadvantages. For example, wire bonding is not particularly adapted for a high density of I/O interconnects between the substrate and the semiconductor die, and has an undesirably high inductance due to the long electrical connection path of wires. In addition, wire bonding is relatively expensive, unreliable and has relatively low productivity due to the manual wire bonding to make interconnection between the semiconductor die and the substrate.

In an attempt to attend to the deficiencies of prior art wire bonding techniques, the so-called Controlled Collapse Chip Connection technology was developed, alternatively referred to in the art as "C4" or "flip-chip" technology. As is known in the art, in flip-chip processing, a semiconductor device, typically a plurality of semiconductor die still in wafer form, is provided having an active surface on which active regions are provided. A contact is provided on the active surface, the contact making electrical connection with an active region. A bumping site is then provided on the contact, referred to in the art as an under-bump metallization (UBM). Numerous of such contacts and sites are provided on the active surface of a semiconductor device, such as 100–1,000 sites per die, typically around 400 per die. The bumping sites are generally composed of a Cr adhesive layer, a Cu solderable layer formed on the Cr layer, and an Au flash layer provided to prevent oxidation of the Cu solderable layer. Thereafter, an Mo mask is positioned over the semiconductor die, the mask having openings corresponding to the bumping sites. Then, Pb and Sn are co-deposited, on the mask and through the mask openings so as to deposit on the individual bumping sites. Thereafter, the die is heated so as to reflow the Pb/Sn material deposited on the bumping sites to form solder bumps. After reflow, the semiconductor die is flipped (i.e., active surface facing downward) and placed on a substrate having complementary lands, which align with the bumps formed on the semiconductor die. A second reflow step is carried out to execute physical and electrical connection between the die (after singulation) and the substrate via the solder bumps which form solder joints.

While flip-chip technology has been widely used in the industry to provide small packages having a high density of I/O interconnections, the flip-chip technique still suffers from several disadvantages. For example, flip-chip technology is relatively expensive, takes several hours to complete (e.g., long cycle time), and requires a custom Mo mask. Due to the use of the mask, a great deal of material (Pb and Sn) is wasted, since the material deposits on the mask (i.e., does not preferentially deposit on the bumping sites exposed through the openings in the mask). Further, the mask is relatively expensive, and cannot be reused more than a few times due to the deposition of the Pb and Sn thereon, even if the mask is cleaned between deposition steps. Further, the thermal expansion mismatch between the semiconductor wafer and the Mo mask prevents use of larger masks for today's large-sized semiconductor wafers. Furthermore, flip-chip technology requires two separate reflows, a first reflow after Pb/Sn deposition to form a solder bump and ensure attachment of the bump to the bumping site of the semiconductor device, and a second reflow to execute electrical and mechanical connection between the semiconductor die and the substrate.

In conjunction with conventional flip-chip processing, use of solder balls has been considered to form landing pads on the substrate to which the bumped semiconductor die is attached, by placing solder balls on a substrate, reflowing and planarizing same. However, this technique still requires the use of conventional flip-chip processing, and suffers from the disadvantages associated therewith.

Accordingly, a need continues to exist in the art for an improved chip-to-package interconnection technique that overcomes the disadvantages associated with manual wire bonding and flip-chip techniques.

BRIEF DESCRIPTION OF THE DRAWINGS

FIGS. 5-1 and 5-2 illustrate another step according to the present invention, wherein solder spheres are released from the stencil and placed on bumping sites on the semiconductor die;

FIGS. 6-1 and 6-2 illustrate a step of preliminary attaching the semiconductor die to a substrate, and inverting or flipping the semiconductor die and substrate.

Figure 1:
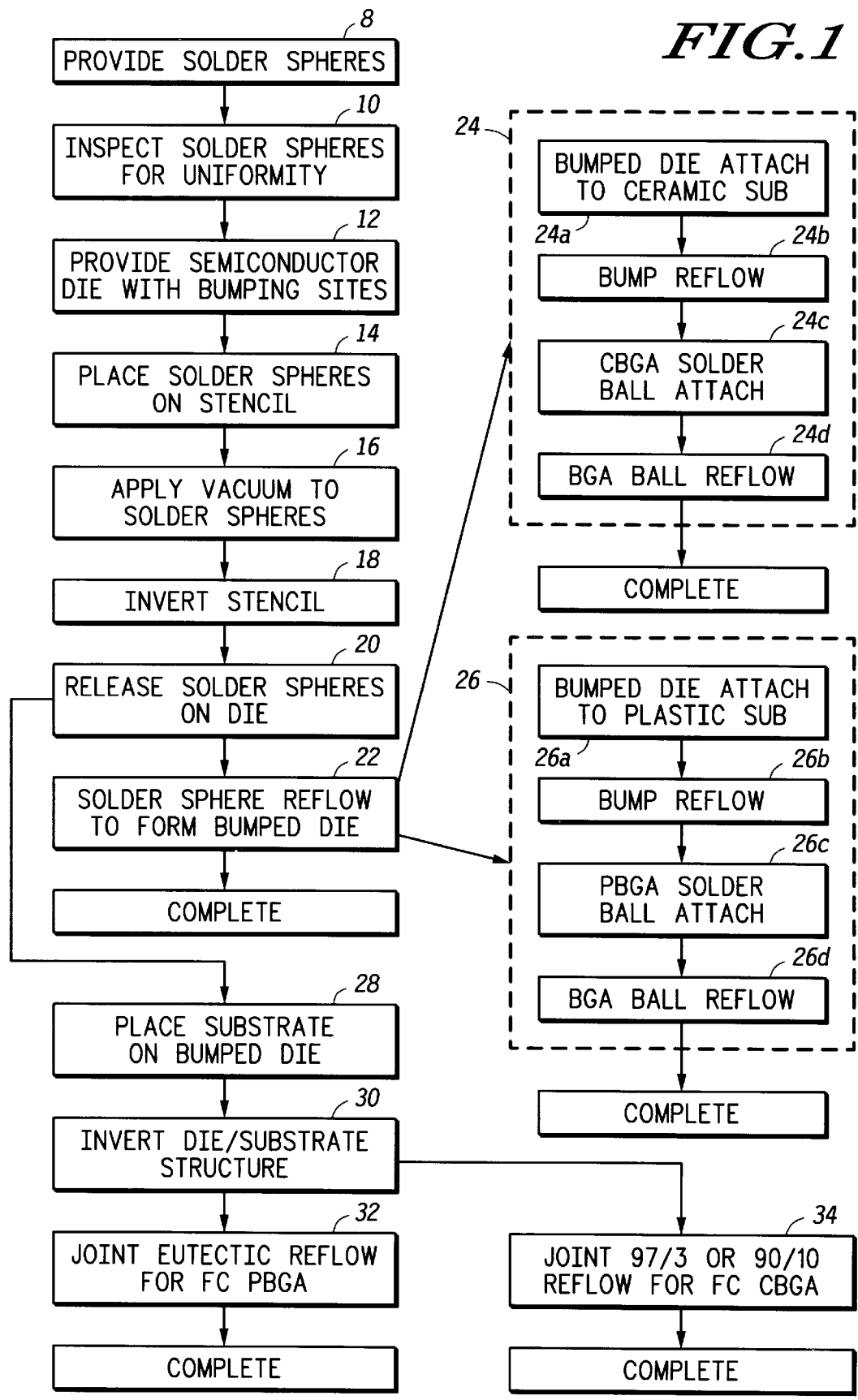
FIG. 1 is a flow diagram showing basic process steps according to the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF PREFERRED EMBODIMENTS

FIG. 1 illustrates the overall flow chart for carrying out various process steps according to the present invention. Reference will be made to FIG. 1 in connection with the more detailed steps shown in FIGS. 2–7. First, solder spheres 210, typically on the order of 25–200 microns in diameter, are provided as indicated in step 8. Preferably, the solder spheres 210 are on the order of 50–150 microns, more preferably, 75–150 microns. Further, depending upon the particular materials of the substrate and thermal history of the semiconductor device, etc., any one of known compositions for the solder may be utilized. For example, 97/3 (i.e., 97% Pb, 3% Sn) high lead solder may be utilized in connection with ceramic substrates. However, due to the lower melting point of plastic substrates, eutectic solder may also be utilized. Both eutectic and 97/3 high lead solder spheres in various sizes are commercially available. Then, as shown in step 10, the solder spheres are inspected for uniformity according to conventional techniques. For example, an optical imaging system may be utilized to identify non-uniform solder spheres, such as spheres having a defect or non-spherical shape beyond a certain tolerance.

Figure 2:
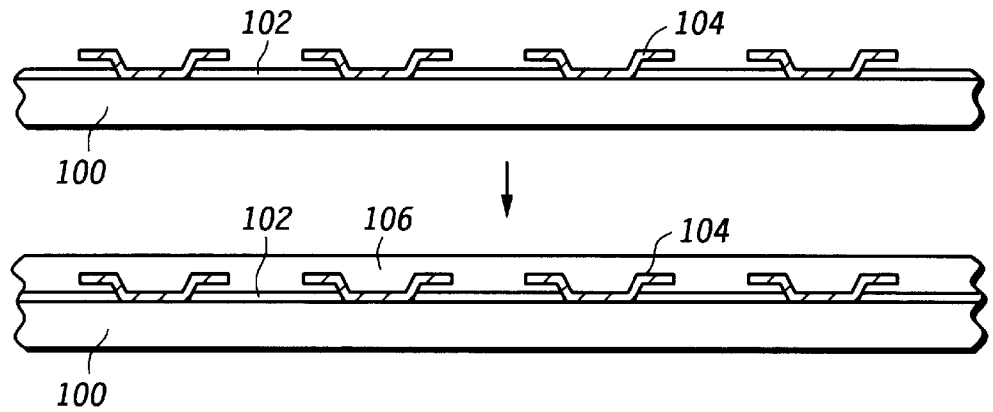
FIG. 2 illustrates a step of providing bumping sites on a semiconductor die, and provision of flux thereon.

Then, as shown in FIG. 2, step 12 provides a semiconductor die 100 having a polyimide passivation layer 102 and a plurality of bumping sites 104 that form an array. Semiconductor die 100 is formed of silicon or other semiconducting starting material. Various conducting and insulating layers are typically grown, deposited, and etched to form integrated circuitry on the starting substrate material. The details of integrated circuitry formation is not important for the purposes of understanding the present invention. Therefore, the starting material and integrated circuitry are collectively represented in FIG. 1 semiconductor die 100. Flux 106 (a conventional material to aid in solder reflow) is provided on the semiconductor die 100 to aid in attachment of solder bumps to the bumping sites 104, described in more detail below.

It is noted that bumping sites 104 may be formed by conventional techniques. For example, as described above with respect to flip-chip technology, a contact is provided for electrical connection to an active region of the semiconductor die 100, and a bumping site 104 is provided thereon, composed of a Cr adhesive layer, a Cu solderable layer, and an Au flash layer. Any other conventional bumping sites may also be utilized, and the invention is not limited to the particular structure of the bumping site.

Figure 3:
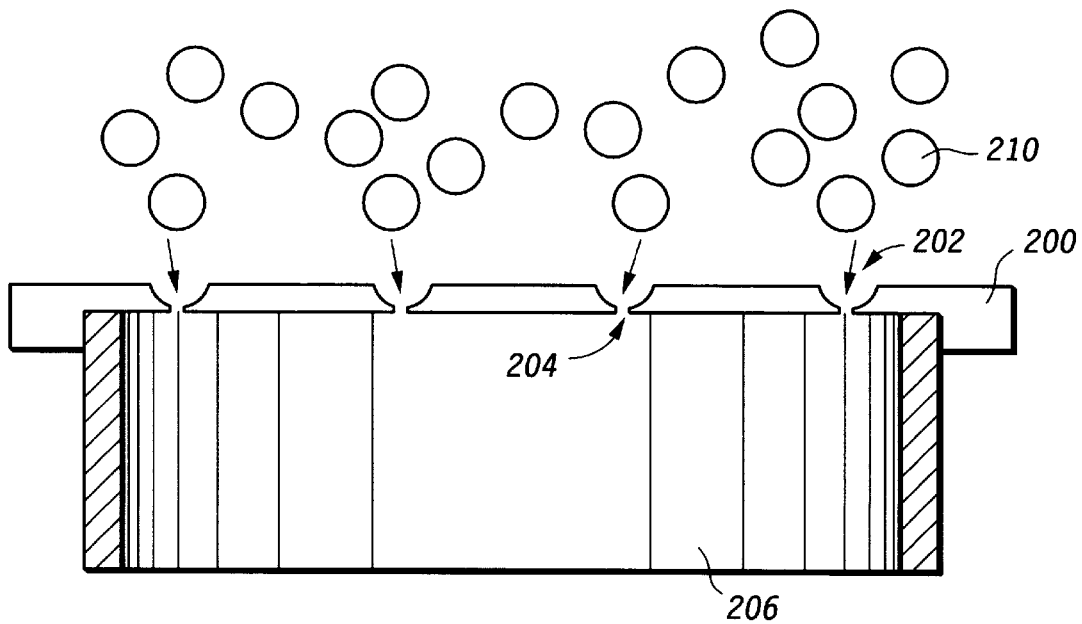
FIG. 3 shows another step of the present invention wherein a stencil having stencil sites is provided, each site receiving a solder sphere and being securely held therein via vacuum.

Turning to FIG. 3, step 14 is carried out wherein solder spheres 210 are placed on a stencil 200. More particularly, solder spheres 210 are placed on stencil 200 having a plurality of stencil sites 202 defined by a depression in the stencil 200. The stencil sites 202 have a complementary configuration (i.e., are provided in the form of an array as a mirror image of the array of the bumping sites 104). A vacuum chuck 206 is attached to the stencil 200, which is adapted to apply a vacuum through vacuum through holes 204 concentrically arranged in each of the stencil sites 202. The vacuum may be achieved by any conventional techniques. A low-level vacuum provided by a simple mechanical pump is sufficient to hold the relatively lightweight solder spheres. Further, the stencil may be made of stainless steel, plastic or other organic resin materials, for example. After placement of solder spheres on the stencil in a random fashion, the stencil may be vibrated while the vacuum is applied thereto via the vacuum chuck 206 (it is noted that the vacuum may be applied before the solder spheres are placed on the stencil). Thereafter, the vacuum is maintained, vibration is stopped, and excess solder spheres, that is, spheres not deposited within the stencil sites 202, may be removed. Removal may be carried out by purging the stencil 200 with an inert gas, such as $N_2$ gas, or by inverting the stencil. By use of a vacuum to hold the solder spheres 210 within the stencil sites 202, the degree of filling of the stencil sites with solder spheres 210 may be easily detected. For example, a pressure sensor may be incorporated that senses a low pressure that is indicative of each of the vacuum through holes 204 being plugged with a solder sphere 210. That is, if any stencil sites are not filled, the pressure within the vacuum chuck 206 remains relatively high, and upon plugging each of the stencil sites, the pressure within vacuum chuck 206 drops by an easily discernible level.

Figure 4:
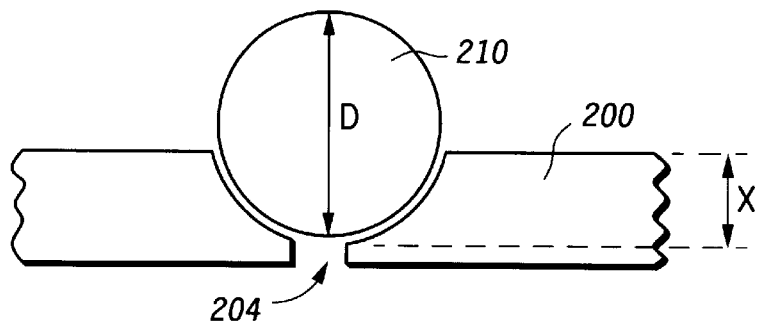
FIG. 4 illustrates, in an exploded view, the manner in which a solder sphere is held in a complementary stencil site.

FIG. 4 illustrates an exploded view of complementary stencil site 202 in which a solder sphere 210 is placed. As shown, the solder sphere has a diameter D, while the depth of stencil site 202 is X. X should be a value that is large enough to ensure sufficient interfacial contact between the solder sphere 210 and the stencil site 202. However, X should be less than 0.5D, preferably less than 0.4D. More preferably, X is not less than 0.1D, and not greater than 0.4D. It is noted that the contour of stencil site 202 is shown as an ideal concave surface. However, the contour may not so closely match the contour of the solder sphere. For example, the contour may be more linear in crosssection due to the limits in forming the stencil sites by an etching technique, for example.

Figures 1, 5:
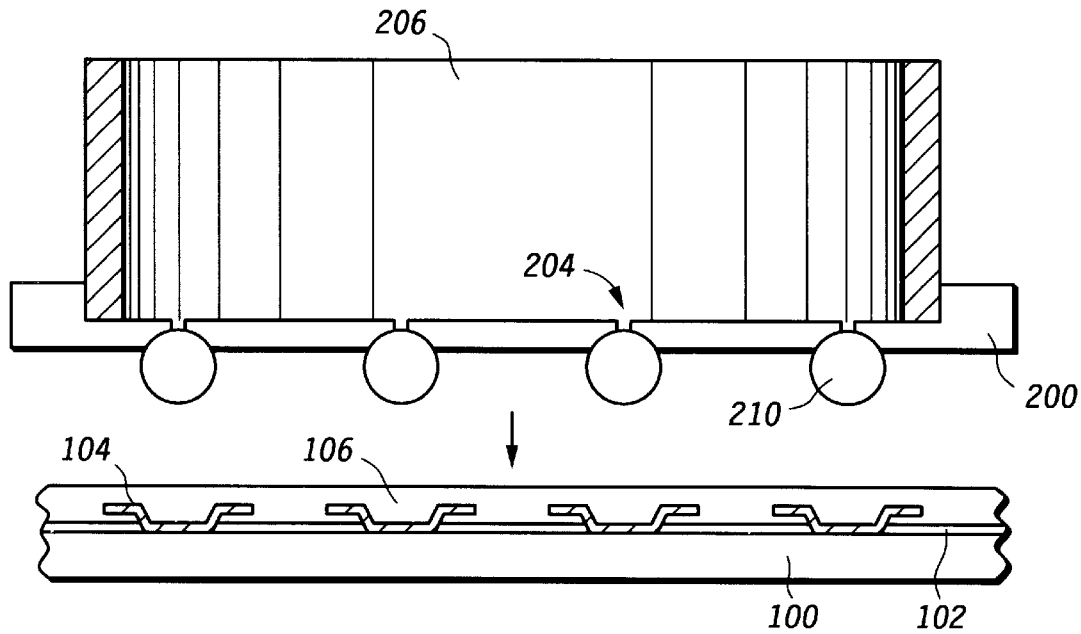
Figures 2, 5:
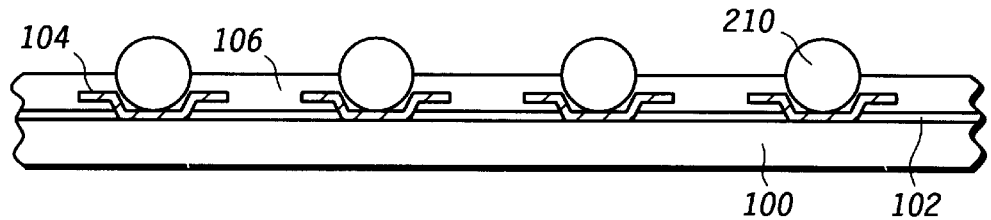

Turning to FIGS. 5-1 and 5-2, steps 18 and 20 are depicted wherein stencil 200 is inverted and the solder spheres 210 are released so as to be placed on the bumping sites 104 of the semiconductor die 100. As shown by the arrow in FIG. 5-1, the stencil 200 (with vacuum applied thereto) is lowered such that the solder spheres 210 make contact with the stencil sites 202. Thereafter, the vacuum is terminated, and the solder spheres 210 are thus deposited on the bumping sites 104. If needed, a reverse-flow of inert gas such as $N_2$ gas may be executed to purge the solder spheres 210 from the stencil sites 202 to aid in release of the solder spheres 210.

While a single die is bumped as shown in the drawings with respect one embodiment of present invention, it is to be understood that a plurality of die, still in wafer form, may be bumped at the same time. In such a case, the die would be singulated prior to attachment to a substrate.

Figure 7:
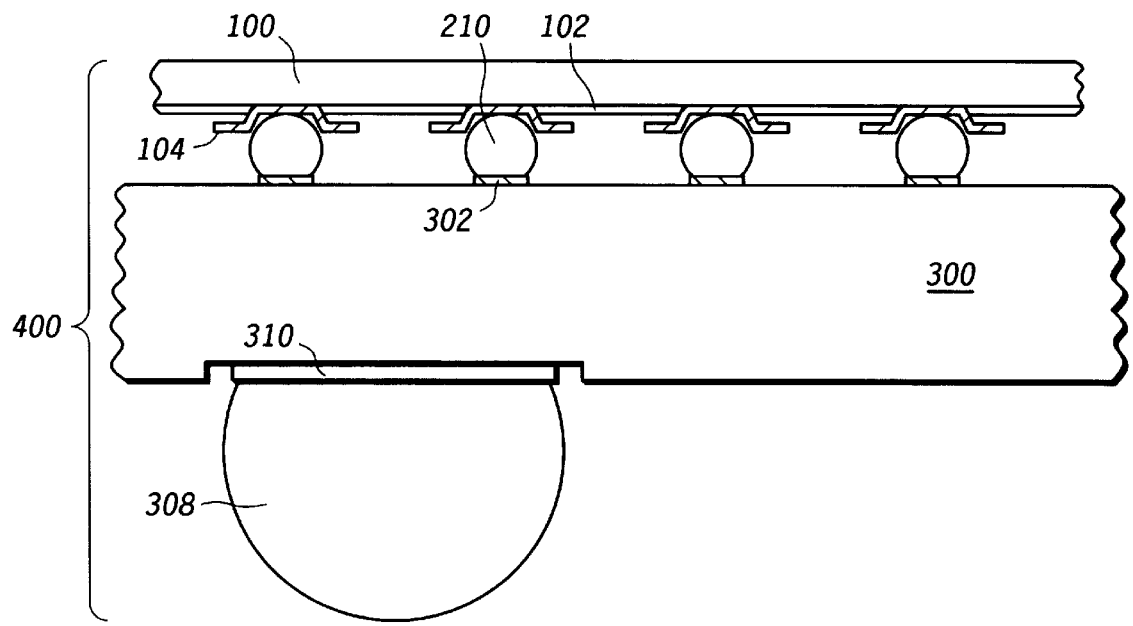
FIG. 7 illustrates the final structure of the flip-chip package after reflow, wherein a ball grid array (BGA) solder ball that provides for second-level interconnection, that is, interconnection between the substrate and a printed circuit board, for example.

In one embodiment, after the solder spheres are placed on the semiconductor die, the solder spheres may be reflowed, as depicted in step 22 in FIG. 1. The semiconductor die 100 is then considered "bumped." The bumped semiconductor die is completed and may be sold at this stage. Alternatively, after reflow at step 22, the bumped semiconductor die may be attached to a substrate by the conventional flip-chip ceramic ball grid array (CBGA) step 24 or the conventional flip-chip plastic ball grid array (PBGA) step 26. As shown in the flow diagram of FIG. 1, the conventional flip-chip CBGA step 24 calls for attaching the bumped die to a ceramic substrate in substep 24a Generally, the solder spheres are formed of a high temperature solder such as 97/3 (97% Pb, 3% Sn)or 90/10 (90% Pb, 10% Sn). The bumps are reflowed at a high temperature on the order of 40020 C. so as to provide mechanical and electrical connection between the bumped die and the ceramic substrate at substep 24b. Then, a CBGA solder ball attach substep 24c is carried out and the solder balls are reflowed via step 24d. See FIG. 7, depicting BGA solder ball 308 provided on BGA landing pad 310.

Alternatively, after solder sphere reflow at step 22, the bumped die may be attached to a plastic substrate via conventional flip-chip plastic ball grid array (PBGA) step 26 as noted above. More particularly, steps 26-1-26d are carried out in a similar fashion to steps 24a–24d of the conventional flip-chip CBGA step. However, according to the conventional flip-chip PBGA step 26, the bumped die is attached to a plastic substrate, not a ceramic substrate, and the solder spheres 210 are generally formed of a solder having a lower melting point, such as eutectic solder. In this regard, bump reflow at substep 26-2 is generally carried out at 220° C. In addition, the BGA reflow at substep 26*d* is carried out at a similarly low temperature.

Figures 1, 6:
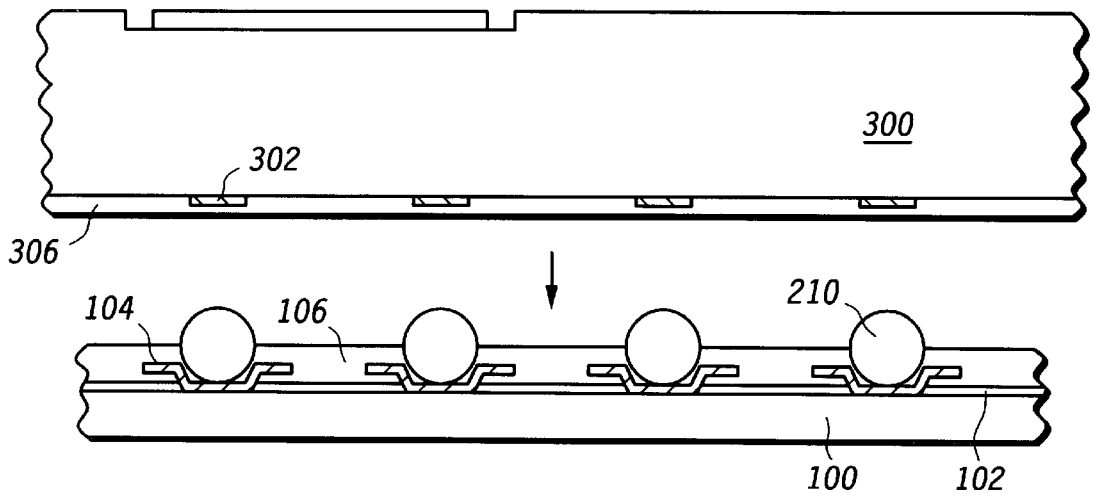
Figures 2, 6:
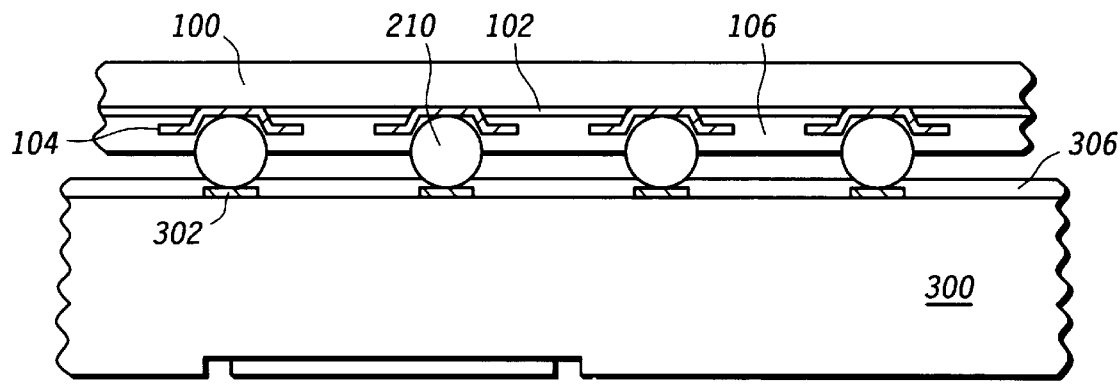

While conventional flip-chip CBGA and PBGA techniques may be utilized to execute package interconnects as noted above with respect to steps 24 and 26, the present invention makes it possible to reflow the solder spheres 210 (i.e., first level interconnects) and BGA interconnects (i.e., second level interconnects) at the same time. Particularly, as shown in FIGS. 6-1 and 6-2, a substrate 300 is provided having a plurality of bumping pads 302 and a layer of flux 306. Substrate 300 is placed on the semiconductor die 100 according to step 28, and the structure is inverted, as shown in FIG. 6-2 and indicated in step 30. While in the embodiment shown the substrate 300 is placed on the semiconductor die, it is to be understood that the semiconductor die 100 may be inverted and placed on the substrate 300. As depicted, the substrate 300 has a BGA landing pad 310. Although only a single BGA landing pad is shown, it is well understood that substrate 300 has plurality of such pads. In addition, a plurality of internal lines (not shown) extend through the substrate to make electrical connection between the bonding pads and the bumping pads. Then, the structure shown in FIG. 6-2 is placed on a graphite boat, as is known in the art for formation of ball grid arrays. The graphite boat (not shown) has a plurality of depressions in which BGA solder balls are placed. Then, a joint eutectic reflow step 32 in the case of a plastic substrate, or alternatively, a joint 97/3 or 90/10 reflow step 34 in the case of a ceramic substrate, is carried out to reflow jointly solder spheres 210 and the BGA solder balls 308 to form the flipchip package 400 depicted in FIG. 7. Thus, in these particular embodiments, not only does the present invention eliminate the need to reflow the solder spheres 210 prior to attachment to the substrate, but also eliminates a separate reflow step in which the BGA solder balls 308 are reflowed. While FIGS. 6-1–7 represent a preferable embodiment, the present invention is not limited to joint reflow of solder spheres 210 and BGA solder balls 308 as described above. Particularly, it is well understood that the solder spheres 210 may be reflowed prior to attachment of the BGA solder balls 308.

Further, in the various process steps shown in FIG. 1 and more particularly shown in FIGS. 2 through 7, appropriate pick-and-place equipment may be utilized to manipulate movement of the semiconductor die, stencil (with vacuum chuck), substrate, etc. Such equipment is well known in the semiconductor processing industry and may be modified for a particular movement by one of ordinary skill in the art.

Accordingly, is quite clear that according to the present invention, an improved, simplified method for bumping a semiconductor device and attaching a semiconductor die to a substrate (i.e., first level chip-to-package interconnection) is provided. The present invention overcomes the disadvantages of the conventional flip-chip technique. Unlike the conventional flip-chip technique, the present method requires only one reflow step to secure electrical and physical connection between the chip (die) and the substrate, rather than two reflow steps. In addition, the present method is cost effective, minimizes material waste, and reduces cycle time.

The method of the present invention has been described in connection with the preferred embodiments as disclosed herein. Although embodiments of the present invention has been shown and described in detail, along with variances thereof, many other varied embodiments that incorporate the teachings of the invention may be easily constructed by those skilled in the art that fall within the scope of the present invention as claimed below.

What is claimed is:

1. A method of bumping a semiconductor device comprising the steps of:
   providing a semiconductor device having a plurality of bumping sites;
   providing a stencil having a plurality of stencil sites, each stencil site comprising a depression and a through hole extending through the stencil;
   providing a plurality of solder spheres, wherein at least one of the solder spheres of the plurality of solder spheres has a diameter D, and wherein at least one of the stencil sites of the plurality of stencil sites has a depression having a depth X, wherein X is not greater than 0.5D;
   placing the plurality of solder spheres on the stencil such that each stencil site of the plurality of stencil sites holds a single solder sphere of the plurality of solder spheres;
   applying a vacuum to the plurality of solder spheres, through the vacuum throughholes;
   aligning the plurality of solder spheres with the plurality of bumping sites of the semiconductor device;
   releasing the vacuum to release the plurality of solder spheres from the stencil such that the plurality of solder spheres is placed on the plurality of bumping sites; and
   reflowing the plurality of solder spheres.

2. The method of claim 1, further comprising a step of providing a vacuum chuck attached to the stencil to apply the vacuum to the plurality of solder spheres.

3. The method of claim 1, further comprising a step of contacting the plurality of solder spheres with the plurality of bumping sites of the semiconductor device prior to releasing the vacuum.

4. The method of claim 1, further comprising a step of reverse flowing a gas through the vacuum throughholes after the vacuum is released to ensure release of the plurality of solder spheres.

5. The method of claim 1, further comprising a step of depositing a flux on the semiconductor device before placing the plurality of solder spheres on the plurality of bumping sites.

6. The method of claim 1, wherein the plurality of solder spheres that is placed on the stencil is greater in number than the plurality of bumping sites, and an excess of solder spheres of the plurality of solder spheres is removed prior to the aligning step.

7. The method of claim 1, wherein X is not greater than 0.4D.

8. The method of claim 7, wherein X is not less than 0.1D.

9. The method of claim 1, wherein the stencil is inverted such that the plurality of solder spheres faces the plurality of bumping sites, before the vacuum is released.

10. The method of claim 1, wherein the semiconductor device is inverted such that the plurality of bumping sites faces the plurality of solder spheres.

11. The method of claim 1, wherein the semiconductor device comprises a singulated die.

12. The method of claim 1, wherein:
   the plurality of bumping sites is arranged in an array,
   the method further comprises a step of providing a substrate having a plurality of bumping pads that is arranged in an array that is complementary to the array of the plurality of bumping sites of the semiconductor device, and
   the step of reflowing is carried out to mechanically and electrically connect the substrate to the semiconductor device.

13. The method of claim 1, wherein the vacuum is applied prior to the step of placing.

14. The method of claim 1, wherein the plurality of bumping sites of the semiconductor device is arranged in an array and the plurality of stencil sites is arranged in an array, the array of the plurality of bumping sites being complementary to the array of the plurality of stencil sites.

15. A method of packaging a semiconductor die, comprising the steps of:

providing a semiconductor die having a plurality of bumping sites arranged in an array;

providing a plurality of solder spheres;

providing a stencil having a plurality of stencil sites arranged in an array that is complementary to the array of the plurality of bumping sites, each stencil site of the plurality of stencil sites comprising a depression and a through hole extending through the stencil;

placing the plurality of solder spheres on the stencil;

moving the plurality of solder spheres relative to the stencil after placing the plurality of solder spheres on the stencil, such that each stencil site of the plurality of stencil sites holds a single solder sphere of the plurality of solder spheres;

applying a vacuum to the plurality of solder spheres, through the vacuum throughholes;

aligning the plurality of solder spheres with the plurality of bumping sites;

releasing the vacuum to release the plurality of solder spheres from the stencil such that the plurality of solder spheres is placed on the plurality of bumping sites;

providing a substrate having a plurality of bumping pads that is arranged in an array that is complementary to the array of the plurality of bumping sites of the semiconductor die; and reflowing the plurality of solder spheres to mechanically and electrically connect the semiconductor die to the substrate.

16. The method of claim 15, further comprising a step of providing a vacuum chuck attached to the stencil to apply the vacuum to the plurality of solder spheres.

17. The method of claim 15, further comprising a step of contacting the plurality of solder spheres with the plurality of bumping sites of the semiconductor die prior to releasing the vacuum.

18. The method of claim 15, further comprising a step of reverse flowing a gas through the vacuum throughholes after the vacuum is released to ensure release of the plurality of solder spheres.

19. The method of claim 15, further comprising a step of depositing a flux on the semiconductor die before placing the plurality of solder spheres on the plurality of bumping sites.

20. The method of claim 15, wherein the plurality of solder spheres that is placed on the stencil is greater in number than the plurality of bumping sites, and an excess of solder spheres of the plurality of solder spheres is removed prior to the aligning step.

21. The method of claim 15, wherein at least one of the solder spheres of the plurality of solder spheres has a diameter D, and at least one of the stencil sites of the plurality of stencil sites has a depression having a depth X, wherein X is not greater than 0.5D.

22. The method of claim 21, wherein X is not greater than 0.4D.

23. The method of claim 22, wherein X is not less than 0.1D.

24. The method of claim 15, wherein the stencil is inverted such that the plurality of solder spheres faces the plurality of bumping sites, before the vacuum is released.

25. The method of claim 15, wherein the semiconductor die is inverted such that the plurality of bumping sites faces the plurality of solder spheres.

26. The method of claim 15, wherein the vacuum is applied prior to the step of placing.

* * * * *